United States Patent [19]
Casper et al.

[11] Patent Number: 6,137,664
[45] Date of Patent: *Oct. 24, 2000

[54] WELL RESISTOR FOR ESD PROTECTION OF CMOS CIRCUITS

[75] Inventors: Stephen L. Casper; Manny K. F. Ma; Joseph C. Sher, all of Boise, Id.

[73] Assignee: Micron Technology, Inc., Boise, Id.

[ * ] Notice: This patent is subject to a terminal disclaimer.

[21] Appl. No.: 09/231,137

[22] Filed: Jan. 15, 1999

Related U.S. Application Data

[63] Continuation of application No. 08/906,174, Aug. 4, 1997, Pat. No. 5,880,917, which is a continuation of application No. 08/515,921, Aug. 16, 1995, Pat. No. 5,654,860.

[51] Int. Cl.⁷ ........................................................ H02H 9/00
[52] U.S. Cl. .......................... 361/56; 361/91.1; 361/111; 361/118
[58] Field of Search ............................... 361/56, 111, 91, 361/117, 118, 119, 127, 58

[56] References Cited

U.S. PATENT DOCUMENTS

| | | | |
|---|---|---|---|
| 4,691,217 | 9/1987 | Ueno et al. | 357/23.13 |
| 4,822,749 | 4/1989 | Flanner et al. | 437/41 |
| 4,977,537 | 12/1990 | Dias et al. | 364/900 |
| 5,051,860 | 9/1991 | Lee et al. | 361/58 |
| 5,066,999 | 11/1991 | Casper | 357/51 |
| 5,148,056 | 9/1992 | Glass et al. | 307/443 |
| 5,227,327 | 7/1993 | Sasaki | 437/60 |
| 5,274,276 | 12/1993 | Casper et al. | 307/443 |
| 5,304,502 | 4/1994 | Hanagasaki | 437/41 |
| 5,440,163 | 8/1995 | Ohhashi | 257/355 |
| 5,565,698 | 10/1996 | Obermeier | 257/360 |
| 5,618,740 | 4/1997 | Huang | 438/224 |
| 5,654,860 | 8/1997 | Casper et al. | 361/91 |
| 5,880,917 | 3/1999 | Casper et al. | 361/56 |
| 5,929,493 | 7/1999 | Wu | 257/369 |
| 5,985,722 | 11/1999 | Kishi | 438/275 |
| 6,004,838 | 12/1999 | Ma et al. | 438/200 |

FOREIGN PATENT DOCUMENTS

| | | | |
|---|---|---|---|
| 0246139 | 11/1987 | European Pat. Off. | H02H 9/00 |
| 0654830 | 5/1995 | European Pat. Off. | H02H 9/00 |
| 2281813 | 3/1995 | United Kingdom | H02H 3/20 |

OTHER PUBLICATIONS

Winnerl, J., "Silicides for High–Density Memory and Logic Circuits", *Semiconductor International*, (4 pages) (Aug. 1994).

*Primary Examiner*—Stephen W. Jackson
*Attorney, Agent, or Firm*—Schwegman, Lundberg, Woessner & Kluth, P.A.

[57] ABSTRACT

A circuit for providing electrostatic discharge (ESD) protection is disclosed. The circuit comprises a pair of CMOS field effect pull up and pull down transistors with reduced resistance source and drain, having a well resistor formed external to them between supply and ground busses respectively. During an ESD event, the well resistors serve to both limit the current flow through the transistors, and reduce the voltage drop across them.

60 Claims, 1 Drawing Sheet

WELL RESISTOR FOR ESD PROTECTION OF CMOS CIRCUITS

This application is a continuation of U.S. Ser. No. 08/906,174 filed Aug. 4, 1997 now U.S. Pat. No. 5,880,917 which is a continuation U.S. Ser. No. 08/515,921 filed Aug. 16, 1995 now issued as U.S. Pat. No. 5,654,860.

FIELD OF THE INVENTION

The present invention relates to apparatus for protecting CMOS transistors from electro static discharge, and in particular the use of external well resistors to provide such protection.

BACKGROUND OF THE INVENTION

In conventional CMOS processes, built-in resistors from the active areas of a transistor protect the pull-up and pull-down devices by absorbing a portion of voltage drops, and also serve to limit the total amount of current that is allowed to flow through the devices during electrostatic discharge (ESD) events. However, in processes where the resistance of the active areas is small, or is reduced to improve the frequency response of CMOS circuitry, the active area resistance no longer functions to provide such a current limiting effect. A need exists to provide for limiting the current through active devices during ESD events without adversely affecting the speed at which such devices operate.

SUMMARY OF THE INVENTION

The present invention provides a method and apparatus for limiting the amount of current flowing through active devices during an ESD event. Well resistors are coupled in series with the pull-up and pull-down transistor pair and the power supply and ground respectively to limit such current. A first well resistor is connected between Vcc power supply line and the pull up transistor to limit current flow to the output when the ESD event strikes the Vcc supply line. A second well resistor is connected between a Vss ground line and the pull down transistor to limit current flow to the output when the ESD event strikes the Vss ground line. The well resistors do not substantially adversely affect the switching speeds of the transistors because they are formed external to the transistors.

In one preferred embodiment, the externally formed well resistors are coupled in series with the pull-up and pull-down devices of a CMOS output driver. The first resistor increases the overall resistance and thereby reduces current flow between the Vcc power supply to the output. The second resistor increases the overall resistance and thereby reduces potential current flow between the Vss ground to the output. Both resistors also provide a large voltage drop during high currents, limiting voltage applied across the transistors. Thus the impact of ESD events occurring on either Vss or Vcc to the devices is limited.

In further embodiments, only one of the pull-up and pull-down devices is protected by an externally formed well resistor depending on which of the Vss or Vcc busses are most likely to be associated with an ESD event. When space on a semiconductor die is limited, protecting only the active areas most likely to be affected by an ESD event provides a designer the ability to provide increased reliability while maintaining high circuit densities.

DESCRIPTION OF THE PREFERRED EMBODIMENT

In the following detailed description of the preferred embodiment, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that structural, logical present inventions. The following detailed description is, therefore, not to be taken in a limiting sense, and the scope of the present invention is defined only by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 1:
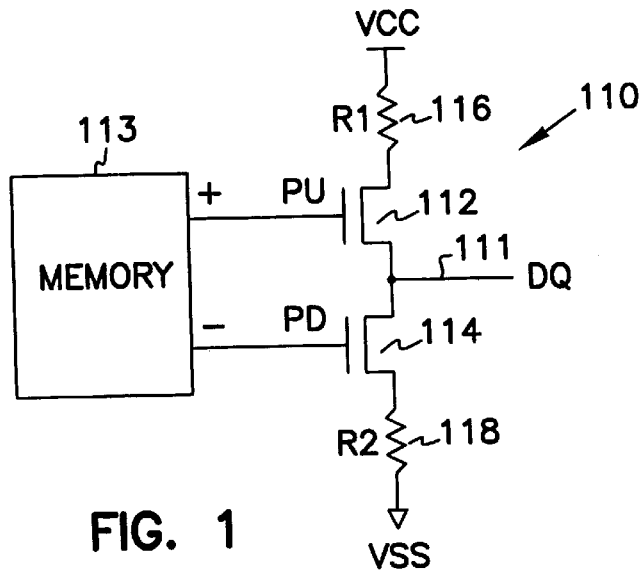
FIG. 1 is a circuit diagram indicating the electrical connections of the N-well resistors of the present invention.

In FIG. 1, an output driver shown generally at 110 provides an output, DQ shown at 111, for circuitry contained on a standard semiconductor die. A pull-up (PU) CMOS enhancement mode insulated gate field effect n channel transistor is shown at 112 with its complimentary pull-down (PD) n channel transistor indicated at 114. The source of transistor 112 is coupled to the drain of transistor 114. The drain of pull-up transistor 112 is coupled through a first N-well resistor R1 indicated at 116 to power supply voltage Vcc. The source of pull-down transistor 114 is coupled through a second N-well resistor R2 indicated at 118 to ground voltage Vss. Thus, each transistor is coupled in series with a N-well resistor to respective busses on which an ESD event is most likely to occur. The N-well resistors serve to limit the current through the channels of the transistors during such an event to reduce the chances of any damage occurring to the transistors. Also, higher currents will result in higher voltages across the N-well resistors, serving to limit the amount of voltage applied to the transistors during an ESD event.

The gate of transistor 112 is coupled to a signal originating from a bit or word line of a dynamic random access memory (DRAM) 113 which is formed on the same substrate as the transistor pair. The complement of the DRAM signal is provided to the gate of transistor 114. The source of the pull up transistor 112 and drain of the pull down transistor 114 are coupled to provide a fast switching high impedance output DQ. The pair serve as a CMOS output driver for providing signals which are coupled to a separate device, such as a bus in a personal computer, or a connector in a circuit card. It should be noted that in many field effect transistors, the source and drain are essentially interchangeable, and interconnections specified herein should not be interpreted as solely limited to those described. In addition, in many cases, the doping of semiconductor structures may be reversed on a wholesale basis to obtain similar functions.

Figure 2:
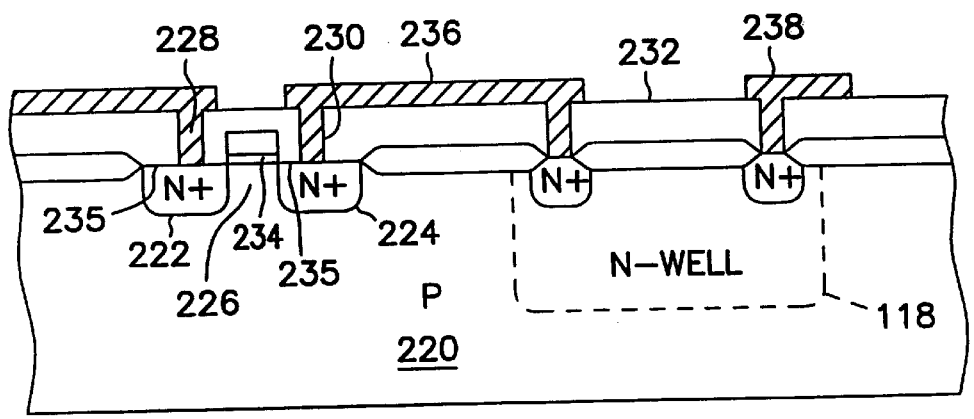
FIG. 2 is a simplified cross section view of a substrate having a portion of the circuit of FIG. 1 formed therein.

A cross section of one of the transistor and resistor pair is shown in FIG. 2. A P type substrate 220 is used to form transistor 114. Active areas 222 and 224 are formed with N+ doping to form the source and drain respectively. This type of field effect transistor is called an N-channel device. Metal contacts 228, and 230 are formed through an insulating layer 232 to provide electrical contact for the source and drain respectively. A metal contact, not visible in this cross section, is formed over a gate dielectric 234 to provide electrical contact for the gate. In addition, in one preferred embodiment, silicide, preferably formed of a metal strapped polysilicon material, with tungsten (WSi2), titanium (TiSi2) or other suitable metal, is applied to the surface of the active N+ areas 222 and 224 as shown at 235 to decrease their resistance, thereby increasing the switching speed of transistor 114. The sheet resistance of the silicide is preferably around 6 ohms per square but may vary with different materials and concentrations. In many prior transistors, the active area resistance served to limit the current through the transistor during an ESD event. Since the resistance of the active areas is now decreased, they no longer serve well for that function.

The N-well resistor, shown at 118 and formed external to the transistor 114 now serves the function of limiting current through the transistor during an ESD event. In one embodiment, the active area drain 230 is coupled by a conductive metal, polysilicon or other suitable conductive layer 236 to the N-well resistor 118, via an N+ region, which is then connected by a further N+ region to a conductive layer 238 to Vss. In another embodiment, the source, 230 is coupled by conductive layer 236 to the N-well resistor 118, which is then connected by conductive layer 238 to the output DQ. Thus, the N-well resistors may be placed on either side of the transistors 112 and 114, so long as they provide a series connection with the transistor to limit current during an ESD event.

Because the N-well resistor is formed external to the transistor 114, it has no direct affect on the switching speed of the transistor itself. It is also, not a critical device that must have closely controlled characteristics. Thus, it may be formed on the edges of the die containing circuitry for which the output driver 110 provides output DQ which is available for connection to other die or devices. Since the edges of a die or chip are subject to the most stress and potential defects due to cutting of the die and misalignment of processes, circuitry is not normally placed in such areas. Thus, the real estate used to form the N-wells is not normally used for circuitry, so the number of usable circuits obtainable on the die is not reduced.

In a further embodiment, only one of pull up transistor 112 and pull down transistor 114 is protected by an externally formed well resistor depending on which of the Vss or Vcc busses are most likely to be associated with an ESD event. When space on a semiconductor die is limited, protecting only the active areas most likely to be affected by an ESD event provides a designer the ability to provide increased reliability while maintaining high circuit densities.

Figure 3:
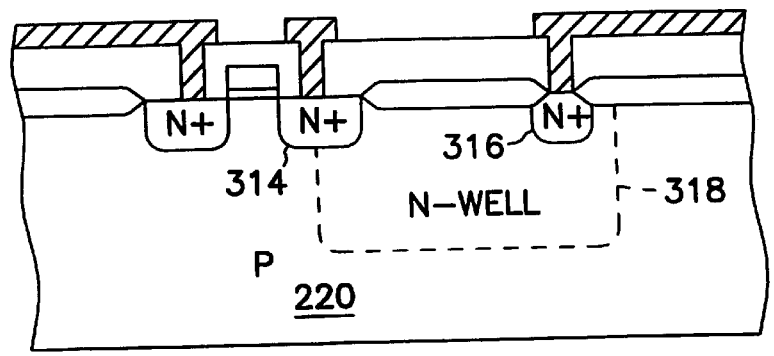
FIG. 3 is a simplified cross section view of a substrate showing an alternative arrangement of the N-well resistors of FIG. 1.

In FIG. 3, an alternative position for an N-well resistor 318 is shown. The N-well resistor 318 is now formed partially overlapping an active area source or drain 314, allowing the active area to provide the dual function of both serving as a source or drain for a transistor, and to serve as a first contact area for N-well resistor 318. A second contact area 316 formed at a far end of the N-well area 318 is coupled to a metalized area, which as in the embodiment of FIG. 2 two is coupled to either a supply voltage, or the output. This alternative embodiment saves space on the die, allowing room for further circuitry.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A driver circuit, comprising:
   a first transistor, having a gate for receiving a first signal, a first source/drain region for receiving a first potential, and a second source/drain region;
   a second transistor, having a gate for receiving a second signal, a first source/drain region for receiving a second potential, and a second source/drain region, wherein the second signal is a complement of the first signal, and wherein the second transistor is deactivated when the first transistor is activated;
   an output line coupled to the second source/drain region of the first transistor and to the second source/drain region of the second transistor, wherein the output line is coupled between the first transistor and the second transistor; and
   a resistor formed external to the first transistor and the second transistor, wherein the resistor is coupled in series between a transistor and node, and wherein the transistor and node are selected from the group consisting of the first transistor and a coupling to the first potential, the first transistor and the output line, the second transistor and a coupling to the second potential, and the second transistor and the output line.

2. The driver circuit of claim 1, wherein the first transistor and the second transistor are both N-channel field effect transistors.

3. The driver circuit of claim 1, wherein the resistor is an N-well resistor.

4. The driver circuit of claim 1, wherein the first transistor and the second transistor are both P-channel field effect transistors.

5. The driver circuit of claim 1, wherein the resistor is a P-well resistor.

6. The driver circuit of claim 1, wherein the resistor further comprises a contact area coupled to a source/drain region of the transistor.

7. The driver circuit of claim 6, wherein the contact area and the source/drain region comprise one active area.

8. The driver circuit of claim 1, wherein the first potential is a power supply and the second potential is a ground.

9. A driver circuit, comprising:
   a first transistor, having a gate for receiving a first signal, a first source/drain region for receiving a first potential, and a second source/drain region;
   a second transistor, having a gate for receiving a second signal, a first source/drain region for receiving a second potential, and a second source/drain region, wherein the second signal is a complement of the first signal, and wherein the second transistor is deactivated when the first transistor is activated;
   an output line coupled to the second source/drain region of the first transistor and to the second source/drain region of the second transistor, wherein the output line is coupled between the first transistor and the second transistor;
   a first resistor formed external to the first transistor and the second transistor, wherein the first resistor is coupled in series between the first transistor and a first node, and wherein the first node is selected from the group consisting of the output line and a coupling to the first potential; and a second resistor formed external to the first transistor and the second transistor, wherein the second resistor is coupled in series between the second transistor and a second node, and wherein the second node is selected from the group consisting of the output line and a coupling to the second potential.

10. The driver circuit of claim 9, wherein the first transistor and the second transistor are both N-channel field effect transistors.

11. The driver circuit of claim 9, wherein the first resistor and the second resistor are both N-well resistors.

12. The driver circuit of claim 9, wherein the first transistor and the second transistor are both P-channel field effect transistors.

13. The driver circuit of claim 9, wherein the first resistor and the second resistor are both P-well resistors.

14. The driver circuit of claim 9, wherein the first resistor further comprises a contact area coupled to a source/drain region of the first transistor.

15. The driver circuit of claim 14, wherein the contact area and the source/drain region comprise one active area.

16. The driver circuit of claim 9, wherein the second resistor further comprises a contact area coupled to a source/drain region of the second transistor.

17. The driver circuit of claim 16, wherein the contact area and the source/drain region comprise one active area.

18. The driver circuit of claim 9, wherein the first potential is a power supply and the second potential is a ground.

19. A memory device, comprising:
    a memory having a first signal and a second signal, wherein the second signal is a complement of the first signal;
    a first transistor, having a gate for receiving the first signal, a first source/drain region for receiving a first potential, and a second source/drain region;
    a second transistor, having a gate for receiving the second signal, a first source/drain region for receiving a second potential, and a second source/drain region, wherein the second transistor is deactivated when the first transistor is activated;
    an output line coupled to the second source/drain region of the first transistor and to the second source/drain region of the second transistor, wherein the output line is coupled between the first transistor and the second transistor; and
    a resistor formed external to the first transistor and the second transistor, wherein the resistor is coupled in series between a transistor and node, and wherein the transistor and node are selected from the group consisting of the first transistor and a coupling to the first potential, the first transistor and the output line, the second transistor and a coupling to the second potential, and the second transistor and the output line.

20. The memory device of claim 19, wherein the first transistor and the second transistor are both N-channel field effect transistors.

21. The memory device of claim 19, wherein the resistor is an N-well resistor.

22. The memory device of claim 19, wherein the first transistor and the second transistor are both P-channel field effect transistors.

23. The memory device of claim 19, wherein the resistor is a P-well resistor.

24. The memory device of claim 19, wherein the resistor further comprises a contact area coupled to a source/drain region of the transistor.

25. The memory device of claim 24, wherein the contact area and the source/drain region comprise one active area.

26. The memory device of claim 19, wherein the first potential is a power supply and the second potential is a ground.

27. A memory device, comprising:
    a memory having a first signal and a second signal, wherein the second signal is a complement of the first signal;
    a first transistor, having a gate for receiving the first signal, a first source/drain region for receiving a first potential, and a second source/drain region;
    a second transistor, having a gate for receiving the second signal, a first source/drain region for receiving a second potential, and a second source/drain region, wherein the second transistor is deactivated when the first transistor is activated;
    an output line coupled to the second source/drain region of the first transistor and to the second source/drain region of the second transistor, wherein the output line is coupled between the first transistor and the second transistor;
    a first resistor formed external to the first transistor and the second transistor, wherein the first resistor is coupled in series between the first transistor and a first node, and wherein the first node is selected from the group consisting of the output line and a coupling to the first potential; and
    a second resistor formed external to the first transistor and the second transistor, wherein the second resistor is coupled in series between the second transistor and a second node, and wherein the second node is selected from the group consisting of the output line and a coupling to the second potential.

28. The memory device of claim 27, wherein the first transistor and the second transistor are both N-channel field effect transistors.

29. The memory device of claim 27, wherein the first resistor and the second resistor are both N-well resistors.

30. The memory device of claim 27, wherein the first transistor and the second transistor are both P-channel field effect transistors.

31. The memory device of claim 27, wherein the first resistor and the second resistor are both P-well resistors.

32. The memory device of claim 27, wherein the first resistor further comprises a contact area coupled to a source/drain region of the first transistor.

33. The memory device of claim 32, wherein the contact area and the source/drain region comprise one active area.

34. The memory device of claim 27, wherein the second resistor further comprises a contact area coupled to a source/drain region of the second transistor.

35. The memory device of claim 34, wherein the contact area and the source/drain region comprise one active area.

36. The memory device of claim 27, wherein the first potential is a power supply and the second potential is a ground.

37. A method of forming a driver circuit, comprising:
    forming a first transistor, having a gate for receiving a first signal, a first source/drain region for receiving a first potential, and a second source/drain region;
    forming a second transistor, having a gate for receiving a second signal, a first source/drain region for receiving a second potential, and a second source/drain region, wherein the second signal is a complement of the first signal, and wherein the second transistor is deactivated when the first transistor is activated;

forming an output line coupled to the second source/drain region of the first transistor and to the second source/drain region of the second transistor, wherein the output line is coupled between the first transistor and the second transistor; and forming a resistor external to the first transistor and the second transistor, wherein the resistor is coupled in series between a transistor and node, and wherein the transistor and node are selected from the group consisting of the first transistor and a coupling to the first potential, the first transistor and the output line, the second transistor and a coupling to the second potential, and the second transistor and the output line.

38. The method of claim 37, wherein forming the driver circuit occurs in the order presented.

39. A method of forming a driver circuit, comprising:

forming a first transistor, having a gate for receiving a first signal, a first source/drain region for receiving a first potential, and a second source/drain region;

forming a second transistor, having a gate for receiving a second signal, a first source/drain region for receiving a second potential, and a second source/drain region, wherein the second signal is a complement of the first signal, and wherein the second transistor is deactivated when the first transistor is activated;

forming an output line coupled to the second source/drain region of the first transistor and to the second source/drain region of the second transistor, wherein the output line is coupled between the first transistor and the second transistor;

forming a first resistor external to the first transistor and the second transistor, wherein the first resistor is coupled in series between the first transistor and a first node, and wherein the first node is selected from the group consisting of the output line and a coupling to the first potential; and forming a second resistor external to the first transistor and the second transistor, wherein the second resistor is coupled in series between the second transistor and a second node, and wherein the second node is selected from the group consisting of the output line and a coupling to the second potential.

40. The method of claim 39, wherein forming the driver circuit occurs in the order presented.

41. A computer, comprising:

a bus; and a driver circuit coupled to the bus, wherein the driver circuit comprises:

a first transistor, having a gate for receiving a first signal, a first source/drain region for receiving a first potential, and a second source/drain region;

a second transistor, having a gate for receiving a second signal, a first source/drain region for receiving a second potential, and a second source/drain region, wherein the second signal is a complement of the first signal, and wherein the second transistor is deactivated when the first transistor is activated;

an output line coupling the driver circuit to the bus, wherein the output line is coupled to the second source/drain region of the first transistor and to the second source/drain region of the second transistor, and wherein the output line is coupled between the first transistor and the second transistor; and a resistor formed external to the first transistor and the second transistor, wherein the resistor is coupled in series between a transistor and node, and wherein the transistor and node are selected from the group consisting of the first transistor and a coupling to the first potential, the first transistor and the output line, the second transistor and a coupling to the second potential, and the second transistor and the output line.

42. The computer of claim 41, wherein the first transistor and the second transistor are both N-channel field effect transistors.

43. The computer of claim 41, wherein the resistor is an N-well resistor.

44. The computer of claim 41, wherein the first transistor and the second transistor are both P-channel field effect transistors.

45. The computer of claim 41, wherein the resistor is a P-well resistor.

46. The computer of claim 41, wherein the resistor further comprises a contact area coupled to a source/drain region of the transistor.

47. The computer of claim 46, wherein the contact area and the source/drain region comprise one active area.

48. The computer of claim 41, wherein the first potential is a power supply and the second potential is a ground.

49. A computer, comprising:

a bus; and a driver circuit coupled to the bus, wherein the driver circuit comprises:

a first transistor, having a gate for receiving a first signal, a first source/drain region for receiving a first potential, and a second source/drain region;

a second transistor, having a gate for receiving a second signal, a first source/drain region for receiving a second potential, and a second source/drain region, wherein the second signal is a complement of the first signal, and wherein the second transistor is deactivated when the first transistor is activated;

an output line coupling the driver circuit to the bus, wherein the output line is coupled to the second source/drain region of the first transistor and to the second source/drain region of the second transistor, and wherein the output line is coupled between the first transistor and the second transistor;

a first resistor formed external to the first transistor and the second transistor, wherein the first resistor is coupled in series between the first transistor and a first node, and wherein the first node is selected from the group consisting of the output line and a coupling to the first potential; and a second resistor formed external to the first transistor and the second transistor, wherein the second resistor is coupled in series between the second transistor and a second node, and wherein the second node is selected from the group consisting of the output line and a coupling to the second potential.

50. The computer of claim 49, wherein the first transistor and the second transistor are both N-channel field effect transistors.

51. The computer of claim 49, wherein the first resistor and the second resistor are both N-well resistors.

52. The computer of claim 49, wherein the first transistor and the second transistor are both P-channel field effect transistors.

53. The computer of claim 49, wherein the first resistor and the second resistor are both P-well resistors.

54. The computer of claim 49, wherein the first resistor further comprises a contact area coupled to a source/drain region of the first transistor.

55. The computer of claim 54, wherein the contact area and the source/drain region comprise one active area.

56. The computer of claim 49, wherein the second resistor further comprises a contact area coupled to a source/drain region of the second transistor.

57. The computer of claim 56, wherein the contact area and the source/drain region comprise one active area.

58. The computer of claim 49, wherein the first potential is a power supply and the second potential is a ground.

59. A system, comprising:
- a processor;
- a bus coupled to the processor; and
- a memory device coupled to the bus, wherein the memory device comprises:
  - a memory, having a first signal and a second signal, wherein the second signal is a complement of the first signal;
  - a first transistor, having a gate for receiving the first signal, a first source/drain region for receiving a first potential, and a second source/drain region;
  - a second transistor, having a gate for receiving the second signal, a first source/drain region for receiving a second potential, and a second source/drain region, wherein the second transistor is deactivated when the first transistor is activated;
  - an output line coupled to the second source/drain region of the first transistor and to the second source/drain region of the second transistor, wherein the output line is coupled between the first transistor and the second transistor, further wherein the output line is coupled to the bus; and
  - a resistor formed external to the first transistor and the second transistor, wherein the resistor is coupled in series between a transistor and node, and wherein the transistor and node are selected from the group consisting of the first transistor and a coupling to the first potential, the first transistor and the output line, the second transistor and a coupling to the second potential, and the second transistor and the output line.

60. A system, comprising:
- a processor;
- a bus coupled to the processor; and
- a memory device coupled to the bus, wherein the memory device comprises:
  - a memory, having a first signal and a second signal, wherein the second signal is a complement of the first signal;
  - a first transistor, having a gate for receiving the first signal, a first source/drain region for receiving a first potential, and a second source/drain region;
  - a second transistor, having a gate for receiving the second signal, a first source/drain region for receiving a second potential, and a second source/drain region, wherein the second transistor is deactivated when the first transistor is activated;
  - an output line coupled to the second source/drain region of the first transistor and to the second source/drain region of the second transistor, wherein the output line is coupled between the first transistor and the second transistor, further wherein the output line is coupled to the bus;
  - a first resistor formed external to the first transistor and the second transistor, wherein the first resistor is coupled in series between the first transistor and a first node, and wherein the first node is selected from the group consisting of the output line and a coupling to the first potential; and
  - a second resistor formed external to the first transistor and the second transistor, wherein the second resistor is coupled in series between the second transistor and a second node, and wherein the second node is selected from the group consisting of the output line and a coupling to the second potential.

* * * * *